(12) United States Patent
Nishioka et al.

(10) Patent No.: US 11,084,902 B2
(45) Date of Patent: Aug. 10, 2021

(54) ALIPHATIC POLYCARBONATE RESIN, PARTITION MATERIAL, SUBSTRATE AND PRODUCTION METHOD THEREFOR, PRODUCTION METHOD FOR WIRING SUBSTRATE, AND WIRING FORMING METHOD

(71) Applicant: SUMITOMO SEIKA CHEMICALS CO., LTD., Hyogo (JP)

(72) Inventors: Kiyoshi Nishioka, Himeji (JP); Hideyuki Takeda, Himeji (JP)

(73) Assignee: SUMITOMO SEIKA CHEMICALS CO., LTD., Hyogo (JP)

( * ) Notice: Subject to any disclaimer, the term of this patent is extended or adjusted under 35 U.S.C. 154(b) by 276 days.

(21) Appl. No.: 16/088,358

(22) PCT Filed: Apr. 5, 2017

(86) PCT No.: PCT/JP2017/014170
§ 371 (c)(1),
(2) Date: Sep. 25, 2018

(87) PCT Pub. No.: WO2017/175777
PCT Pub. Date: Oct. 12, 2017

(65) Prior Publication Data
US 2020/0308344 A1      Oct. 1, 2020

(30) Foreign Application Priority Data
Apr. 8, 2016   (JP) .............................. JP2016-077960

(51) Int. Cl.
*C08G 64/02*   (2006.01)
*H05K 1/03*   (2006.01)
*H05K 3/10*   (2006.01)

(52) U.S. Cl.
CPC ....... *C08G 64/0233* (2013.01); *H05K 1/0313* (2013.01); *H05K 3/107* (2013.01)

(58) Field of Classification Search
CPC ................................................ C08G 64/0233
See application file for complete search history.

(56) References Cited

U.S. PATENT DOCUMENTS

| | | | | |
|---|---|---|---|---|
| 3,220,978 A | * | 11/1965 | Jaquiss .............. | C08G 64/0233 528/202 |
| 3,510,458 A | * | 5/1970 | Thayer, Jr. ......... | C08G 64/0233 528/370 |
| 2010/0305281 A1 | * | 12/2010 | Fujiwara ............ | C08G 64/0241 525/461 |
| 2015/0299389 A1 | * | 10/2015 | Jiang .................... | C09D 169/00 525/461 |

FOREIGN PATENT DOCUMENTS

| | | |
|---|---|---|
| JP | 54-148097 A | 11/1979 |
| JP | 06-334282 A | 12/1994 |
| JP | 10-158380 A | 6/1998 |
| JP | 2010-106286 A | 5/2010 |
| JP | 2014-055232 A | 3/2014 |
| JP | 2015-197519 A | 11/2015 |
| WO | 2004/042797 A2 | 5/2004 |

OTHER PUBLICATIONS

Machine Translation of JP S54-148097 (Year: 2020).*
Nobuoka et al. Development of Ester Free Type Poly(trimethylene carbonate) Derivatives with Pendant Fluoroaromatic Groups. Macromol. Chem. Phys. 2019, 220, 1900051. DOI: 10.1002/macp.201900051. (Year: 2019).*
Translation of JP S54-148097 A from Steven Spar (Year: 2021).*
Extended European Search Report dated Aug. 22, 2019, from the European Patent Office in counterpart European Application No. 17779155.5.
Renate Förch et al., "Appendix C Contact Angle Goniometry Surface Design: Applications in Bioscience and Nanotechnology", Wiley-VCH Verlag GmbH & Co. KGaA, Jun. 12, 2019, Weinheim, pp. 471-473 (4 pages total).
International Search Report of PCT/JP2017/014170 dated May 30, 2017 [PCT/ISA/210].

* cited by examiner

*Primary Examiner* — Michael M Dollinger
(74) *Attorney, Agent, or Firm* — Sughrue Mion, PLLC

(57) ABSTRACT

Provided is an aliphatic polycarbonate resin having excellent water repellency. Also provided are a partition material, a substrate and a method for producing the same, a method for producing a wiring substrate, and a wiring forming method.

The aliphatic polycarbonate resin of the present invention comprises a structural unit represented by the following formula (1):

$$\left[\begin{array}{c} O \\ \| \\ O-C-O-\underset{R^2}{\overset{R^1}{C}}-\underset{}{\overset{X}{C}}-\\ R^3 \end{array}\right] \quad (1)$$

wherein $R^1$, $R^2$, and $R^3$ are each independently a hydrogen atom, a $C_1$-$C_{10}$ alkyl group, or a $C_6$-$C_{20}$ aryl group; X is a substituent having a fluorine atom; and $R^1$, $R^2$, and $R^3$ may be the same or different; and the aliphatic polycarbonate resin has a contact angle against water of 90° or more.

10 Claims, No Drawings

ALIPHATIC POLYCARBONATE RESIN, PARTITION MATERIAL, SUBSTRATE AND PRODUCTION METHOD THEREFOR, PRODUCTION METHOD FOR WIRING SUBSTRATE, AND WIRING FORMING METHOD

CROSS REFERENCE TO RELATED APPLICATIONS

This application is a National Stage of International Application No. PCT/JP2017/014170 filed Apr. 5, 2017, claiming priority based on Japanese Patent Application No. 2016-077960 filed Apr. 8, 2016.

TECHNICAL FIELD

The present invention relates to an aliphatic polycarbonate resin, a partition material, a substrate and a method for producing the same, a method for producing a wiring substrate, and a wiring forming method.

BACKGROUND ART

Aliphatic polycarbonate resins synthesized from raw materials containing carbon dioxide and epoxy compounds have been actively studied in recent years in terms of recycling carbon dioxide, and various applications thereof have been found. Since aliphatic polycarbonate resins have characteristically low thermal decomposition temperatures, their application to ceramic binders and metal ink by taking advantage of this characteristic has been examined (e.g., PTL 1 and PTL 2). Moreover, because aliphatic polycarbonate resins can be easily removed by heating or short-wavelength light (e.g., irradiation with vacuum ultraviolet rays or soft X-rays), the use of aliphatic polycarbonate resins as partition material positive resist resins has also been examined (e.g., PTL 3 and PTL 4). Thus, due to the use of aliphatic polycarbonate resins as partition material positive resist resins, wiring substrates to be incorporated into electronic components etc. can be produced. For example, a partition pattern is formed on a substrate using an aliphatic polycarbonate resin, and a groove is formed by photolithography or the like. Then, a wiring material containing, for example, metal ink is provided in the groove. Subsequently, sintering is performed to remove the aliphatic polycarbonate resin, and curing and sintering of the ink proceed. A wiring substrate is formed in this manner.

CITATION LIST

Patent Literature

PTL 1: JPH06-334282A
PTL 2: JP2014-055232A
PTL 3: JP2010-106286A
PTL 4: JP2015-197519A

SUMMARY OF INVENTION

Technical Problem

When a wiring substrate is produced using a substrate having a partition pattern made of an aliphatic polycarbonate resin as described above, water-based ink is often used as the ink that is a wiring material. This is because there is a possibility that the aliphatic polycarbonate resin may be dissolved and swollen in an organic solvent, and it is thus necessary to avoid collapse etc. of the partition.

However, conventional aliphatic polycarbonate resins (e.g., polypropylene carbonate resins) have low water repellency; thus, when ink was placed on a substrate by ink immersion or the like, the ink was also likely to be placed on the aliphatic polycarbonate resin, which was a partition material. Therefore, in the production of wiring substrates, it was difficult to allow the ink to remain only in the groove, and it was difficult to form desired wiring patterns with high accuracy. From this viewpoint, there has been a demand for the development of aliphatic polycarbonate resins having more excellent water repellency than conventional resins.

The present invention was made in view of the above circumstances. An object of the present invention is to provide an aliphatic polycarbonate resin having excellent water repellency. Another object of the present invention is to provide a partition material, a substrate and a method for producing the same, a method for producing a wiring substrate, and a wiring forming method.

Solution to Problem

The present inventors conducted extensive research to achieve the above objects, and consequently found that the above objects can be achieved by an aliphatic polycarbonate resin having a repeating structural unit with a specific structure. Thus, the present invention has been completed.

Specifically, the present invention includes, for example, the main subjects described in the following items.

Item 1. An aliphatic polycarbonate resin comprising a structural unit represented by the following formula (1):

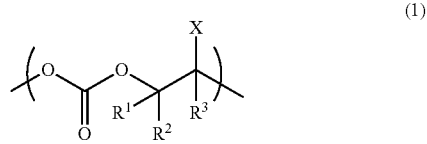

wherein $R^1$, $R^2$, and $R^3$ are each independently a hydrogen atom, a $C_1$-$C_{10}$ alkyl group, or a $C_6$-$C_{20}$ aryl group; X is a substituent having a fluorine atom; and $R^1$, $R^2$, and $R^3$ may be the same or different; and the aliphatic polycarbonate resin having a contact angle against water of 900 or more.

Item 2. The aliphatic polycarbonate resin according to Item 1, wherein X is a group containing a trifluoromethyl group.

Item 3. The aliphatic polycarbonate resin according to Item 1 or 2, wherein the structural unit represented by the formula (1) is contained in an amount of 0.05 to 5 mol % based on the total number of moles of all structural units.

Item 4. The aliphatic polycarbonate resin according to any one of Items 1 to 3, further comprising a structural unit represented by the following formula (2):

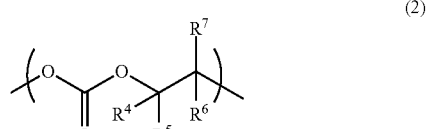

wherein $R^4$, $R^5$, $R^6$, and $R^7$ are each independently a hydrogen atom, a $C_1$-$C_{10}$ alkyl group, or a $C_6$-$C_{20}$ aryl group; and $R^4$, $R^5$, $R^6$, and $R^7$ may be the same or different.

Item 5. The aliphatic polycarbonate resin according to any one of Items 1 to 4, which is an aliphatic polycarbonate resin for partition formation.

Item 6. A partition material comprising the aliphatic polycarbonate resin according to Item 5.

Item 7. A substrate having a partition made of the aliphatic polycarbonate resin according to Item 5.

Item 8. A method for producing the substrate according to Item 7, the method comprising providing a coating film of a partition material comprising the aliphatic polycarbonate resin to form a partition.

Item 9. A method for producing a wiring substrate using the substrate according to Item 7, the method comprising providing a wiring material on the substrate to form wiring.

Item 10. The method for producing a wiring substrate according to Item 9, the method comprising forming a groove in the substrate, and providing a wiring material in the groove to form wiring.

Item 11. A wiring forming method comprising forming wiring using the partition material according to Item 6.

Advantageous Effects of Invention

The aliphatic polycarbonate resin according to the present invention has water-repellent performance superior to that of conventionally known aliphatic polycarbonate resins. Therefore, for example, when a partition is formed using the aliphatic polycarbonate resin of the present invention as a partition material, water-based ink is allowed to remain only in a desired portion with high accuracy.

Because the partition material according to the present invention contains the above polycarbonate resin, a partition that allows water-based ink to remain only in a desired portion with high accuracy can be formed.

DESCRIPTION OF EMBODIMENTS

Embodiments of the present invention are described in detail below. In the present specification, the terms "comprise" and "contain" include the concepts of "comprise," "contain," "substantially consist of," and "consist of."

The aliphatic polycarbonate resin of the present embodiment contains a structural unit represented by the following formula (1):

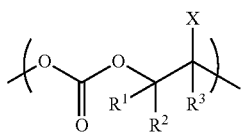

(1)

wherein $R^1$, $R^2$, and $R^3$ are each independently a hydrogen atom, a $C_1$-$C_{10}$ alkyl group, or a $C_6$-$C_{20}$ aryl group; X is a substituent having a fluorine atom; and $R^1$, $R^2$, and $R^3$ may be the same or different; and the aliphatic polycarbonate resin has a contact angle against water of 90° or more.

Due to the structural unit having the specific structure, the above aliphatic polycarbonate resin has water-repellent performance superior to that of conventional aliphatic polycarbonate resins. Therefore, for example, when the aliphatic polycarbonate resin is used as a partition material to form a partition, water-based ink is allowed to remain only in a desired portion with high accuracy.

In the formula (1), the type of $C_1$-$C_{10}$ alkyl group as $R^1$, $R^2$, and $R^3$ may be linear or branched, and the alkyl group may have one or more substituents. Specific examples of the $C_1$-$C_{10}$ alkyl group include methyl, ethyl, n-propyl, isopropyl, n-butyl, sec-butyl, tert-butyl, n-pentyl, n-hexyl, n-heptyl, n-octyl, n-nonyl, and n-decyl groups.

The above alkyl group more preferably has 1 to 4 carbon atoms.

In the formula (1), the $C_6$-$C_{20}$ aryl group as $R^1$, $R^2$, and $R^3$ may be substituted or unsubstituted. Specific examples of the aryl group include phenyl, tolyl, indenyl, naphthyl, and tetrahydronaphthyl groups.

The above aryl group more preferably has 6 to 14 carbon atoms.

X, which is a substituent having a fluorine atom, may be a fluorine atom or a group containing a fluorine atom. X as a group containing a fluorine atom is, for example, a $C_1$-$C_{10}$ fluoroalkyl group, a $C_1$-$C_{10}$ perfluoroalkyl group, a $C_1$-$C_{10}$ fluoroalkoxy group, a $C_1$-$C_{10}$ perfluoroalkoxy group, a $C_6$-$C_{20}$ fluoroaryl group, or a $C_6$-$C_{20}$ perfluoroaryl group.

The number of fluorine atoms that constitute a $C_1$-$C_{10}$ fluoroalkyl group may be only one or may be two or more. Examples of the $C_1$-$C_{10}$ fluoroalkyl group include groups in which some hydrogen atoms of the $C_1$-$C_{10}$ alkyl groups mentioned above are replaced by fluorine atoms.

The number of fluorine atoms that constitute a $C_1$-$C_{10}$ fluoroalkoxy group may be only one or may be two or more. Examples of the $C_1$-$C_{10}$ fluoroalkoxy group include groups in which some hydrogen atoms of methoxy, ethoxy, n-propoxy, isopropoxy, n-butoxy, sec-butoxy, tert-butoxy, or the like are replaced by fluorine atoms.

The number of fluorine atoms that constitute a $C_6$-$C_{20}$ fluoroaryl group may be only one or may be two or more. Examples of the $C_6$-$C_{20}$ fluoroaryl group include groups in which some hydrogen atoms of the $C_6$-$C_{20}$ aryl group mentioned above are replaced by fluorine atoms.

X as a substituent having a fluorine atom may contain an ether group, an ester group, a carbonate group, an amino group, an amide group, a carbonyl group, etc.

X as a substituent having a fluorine atom is preferably a group containing a trifluoromethyl group ($CF_3$—). It is assumed that when a trifluoromethyl group is contained, the trifluoromethyl group with low surface free energy is easily segregated to the uppermost surface. The water repellency of the aliphatic polycarbonate resin can be thereby further improved.

The aliphatic polycarbonate resin of the present embodiment may consist of the structural unit represented by the formula (1), or may comprise other structural units other than the structural unit represented by the formula (1).

In the aliphatic polycarbonate resin of the present embodiment, the content of the structural unit represented by the formula (1) is preferably 5 mol % or less, and more preferably 0.05 mol % or more, based on the total number of moles of all structural units. In this case, the polymerization reactivity in the production of the aliphatic polycarbonate resin, and the solubility of the aliphatic polycarbonate resin in solvents are improved, and desired water repellency tends to be easily obtained. In the aliphatic polycarbonate resin of the present embodiment, the content of the structural unit represented by the formula (1) is more preferably 2 mol % or less based on the total number of moles of all structural units. Moreover, in the aliphatic polycarbonate resin of the present embodiment, the content of the structural unit represented by the formula (1) is more preferably 0.1 mol % or more based on the total number of moles of all structural units.

The aliphatic polycarbonate resin of the present embodiment may further contain a structural unit represented by the following formula (2):

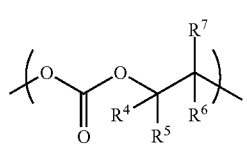

(2)

wherein $R^4$, $R^5$, $R^6$, and $R^7$ are each independently a hydrogen atom, a $C_1$-$C_{10}$ alkyl group, or a $C_6$-$C_{20}$ aryl group; and $R^4$, $R^5$, $R^6$, and $R^7$ may be the same or different.

In the formula (2), the $C_1$-$C_{10}$ alkyl group and $C_6$-$C_{20}$ aryl group as $R^4$, $R^5$, $R^6$, and $R^7$ are the same as the $C_1$-$C_{10}$ alkyl group and $C_6$-$C_{20}$ aryl group as $R^1$, $R^2$, and $R^3$ of the formula (1), respectively. The alkyl group as $R^4$, $R^5$, $R^6$, and $R^7$ more preferably has 1 to 4 carbon atoms. The aryl group as $R^4$, $R^5$, $R^6$, and $R^7$ more preferably has 6 to 14 carbon atoms.

In the aliphatic polycarbonate resin of the present embodiment, the content of the structural unit represented by the formula (2) is preferably 95 mol % or more, and more preferably 98 mol % or more, based on the total number of moles of all structural units. In this case, the aliphatic polycarbonate resin has excellent water repellency.

The mass average molecular weight of the aliphatic polycarbonate resin of the present embodiment is preferably 50000 or more, and more preferably 100000 or more, in terms of rectangular shape-retaining power when used as a partition material. Moreover, in terms of avoiding the reduction in handling properties due to the decrease in the solubility of the aliphatic polycarbonate resin in solvents, the mass average molecular weight of the aliphatic polycarbonate resin is preferably 1 million or less, and more preferably 500000 or less.

The contact angle of the aliphatic polycarbonate resin of the present embodiment against water is 900 or more. In this case, the aliphatic polycarbonate resin exhibits desired water repellency. The contact angle of the aliphatic polycarbonate resin against water is preferably 95° or more. The above contact angle is generally less than 1800 (e.g., less than 1500).

The contact angle as mentioned in the present specification is defined by a value measured in the following manner. First, the aliphatic polycarbonate resin of the present embodiment is dissolved in acetone so that the concentration is 2.5 mass %, and a glass substrate is immersed in the obtained solution. Then, the glass substrate (glass substrate in which the solution is attached to the surface thereof) removed from the solution is dried at 25° C. for 24 hours to thereby prepare a sample for contact angle measurement. A drop of distilled water is dropped on the obtained measurement sample by a microsyringe so that the droplet diameter is 2 mm, and the contact angle is measured. This measurement is performed in an environment at a temperature of 25° C. and a humidity RH of 50%. The contact angle can be measured using a commercially available contact angle meter.

The aliphatic polycarbonate resin of the present embodiment may contain other types of polycarbonate resin and other resin components within a range that does not impair the effects of the present invention.

The aliphatic polycarbonate resin of the present embodiment can be used, for example, after dissolution in a solvent that can dissolve the aliphatic polycarbonate resin.

Examples of the solvent that can dissolve the aliphatic polycarbonate resin include toluene, ethyl acetate, butyl acetate, isopropyl alcohol, methyl isobutyl ketone, acetone, methyl ethyl ketone, N-methyl-2-pyrrolidone, ethylene glycol ethyl ether, ethylene glycol monobutyl ether, ethylene glycol monoethyl ether acetate, diethylene glycol monoethyl ether, diethylene glycol monomethyl ether, diethylene glycol monoisobutyl ether, trimethyl pentanediol monoisobutyrate, ethyl carbitol, butyl carbitol, ethyl carbitol acetate, butyl carbitol acetate, terpineol, terpineol acetate, dihydro terpineol, dihydro terpineol acetate, texanol, isophorone, butyl lactate, dioctyl phthalate, dioctyl adipate, benzyl alcohol, phenylpropylene glycol, cresol, N,N-dimethylformamide, propylene carbonate, and the like. Of these, N-methyl-2-pyrrolidone, terpineol, terpineol acetate, ethyl carbitol acetate, butyl carbitol acetate, texanol, and propylene carbonate are preferable, because they have a moderately high boiling point and are likely to be uniformly volatilized during sintering. These organic solvents may be used singly or in combination of two or more.

The amount of the above solvent to be used (blended) is preferably 100 to 2000 parts by mass, more preferably 200 to 1500 parts by mass, and even more preferably 300 to 1000 parts by mass, based on 100 parts by mass of the aliphatic polycarbonate resin, in terms of ease of handling of a solution to be obtained (a solution of the aliphatic polycarbonate resin of the present invention).

Examples of the method for producing the aliphatic polycarbonate resin of the present embodiment include a method of subjecting an epoxide and carbon dioxide to a polymerization reaction in the presence of a metal catalyst.

By selecting the type of epoxide, an aliphatic polycarbonate resin having the structural unit represented by the formula (1), and further optionally having the structural unit represented by the formula (2), can be obtained.

Examples of the epoxide used to form the structural unit represented by the formula (1) include epoxides represented by the following formula (3):

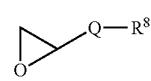

(3)

wherein $R^8$ is a fluorine atom or a monovalent organic group containing a fluorine atom, and Q is a single bond or a divalent linking group that does not contain a fluorine atom. These epoxides may be used singly or in combination of two or more.

In the formula (3), the Q-$R^8$ portion corresponds to X in the formula (1).

When $R^8$ is a monovalent organic group containing a fluorine atom, examples of $R^8$ include fluoroalkyl groups, such as monofluoromethyl, difluoromethyl, 2,2,2-trifluoroethyl, and 1,1,1-3,3,3-hexafluoroisopropyl; perfluoroalkyl groups, such as trifluoromethyl, pentafluoroethyl, perfluoropropyl, and perfluorobutyl; fluoroaryl groups, such as 4-fluorophenyl, 2,6-difluorophenyl, and 2,4,6-trifluorophenyl; perfluoroaryl groups, such as pentafluorophenyl and perfluoronaphthyl; and the like.

In the formula (3), when Q is a divalent linking group that does not contain a fluorine atom, Q is preferably an alkylene group, or an alkylene group containing an ether oxygen atom, an ester group, a carbonate group, an amino group, an amide group, or a carbonyl group; and more preferably an alkylene group or an alkylene group containing an ether oxygen atom. The alkylene group is preferably a linear alkylene group having one or more carbon atoms, such as a methylene group (—$CH_2$—), an ethylene group (—$CH_2CH_2$—), or a propylene group (—$CH_2CH_2CH_2$—); and particularly preferably a $C_1$-$C_5$ linear alkylene group. The alkylene group containing an ether oxygen atom is preferably a group in which an oxygen atom is inserted between the carbons of the above alkylene group, or a group in which an oxygen atom is inserted into the terminal part of the alkylene group (terminal part on the $R^9$ side); and more preferably a group in which an oxygen atom bonds to the terminal part of a $C_1$-$C_4$ linear alkylene group (terminal part on the $R^8$ side), or a group in which an oxygen atom is inserted into 1 or 2 portions between the carbons of a $C_2$-$C_4$ linear alkylene group (e.g., —$CH_2O$—, —$CH_2OCH_2$—, or —$CH_2OCH_2CH_2$—).

In the formula (3), when Q is a single bond, $R^8$ directly bonds to the carbon atom of the epoxy group.

Examples of the epoxide used to form the structural unit represented by the formula (2) include ethylene oxide, propylene oxide, 2-butene oxide, and isobutylene oxide. Of these, ethylene oxide and propylene oxide are preferable because they have high reactivity. These epoxides may be used singly or in combination of two or more.

Examples of the metal catalyst include zinc-based catalysts, aluminum-based catalysts, chromium-based catalysts, cobalt-based catalysts, and the like. Of these, zinc-based catalysts are preferable, because they have high polymerization activity and wide substrate versatility in the polymerization reaction between an epoxide and carbon dioxide.

Examples of zinc-based catalysts include organozinc catalysts, such as zinc acetate, diethyl zinc, and dibutyl zinc; organozinc catalysts obtained by reaction of zinc compounds and compounds such as primary amine, divalent phenol (benzenediol), aromatic dicarboxylic acid, aromatic hydroxy acid, aliphatic dicarboxylic acid, or aliphatic monocarboxylic acid; and the like. Of these organozinc catalysts, organozinc catalysts obtained by reaction of zinc compounds, aliphatic dicarboxylic acid, and aliphatic monocarboxylic acid are preferable because they have higher polymerization activity; and organozinc catalysts obtained by reaction of zinc oxide, glutaric acid, and acetic acid are more preferable.

A reaction solvent may be used for the polymerization reaction, if necessary. Various organic solvents can be used as the reaction solvent. Examples of organic solvents include aliphatic hydrocarbon-based solvents, such as pentane, hexane, octane, decane, and cyclohexane; aromatic hydrocarbon-based solvents, such as benzene, toluene, and xylene; halogenated hydrocarbon-based solvents, such as methylene chloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; ether-based solvents, such as dimethoxyethane, tetrahydrofuran, 2-methyltetrahydrofuran, 1,4-dioxane, and 1,3-dioxolane; ester-based solvents, such as ethyl acetate, n-propyl acetate, and isopropyl acetate; amide-based solvents, such as N,N-dimethylformamide and N,N-dimethylacetamide; carbonate-based solvents, such as dimethyl carbonate, ethylmethyl carbonate, diethyl carbonate, and propylene carbonate; and the like. These organic solvents may be used singly or in combination of two or more.

The amount of the reaction solvent to be used is preferably 100 to 10000 parts by mass based on 100 parts by mass of the epoxide, in terms of smoothly promoting the reaction.

The method for subjecting an epoxide and carbon dioxide to a polymerization reaction in the presence of a metal catalyst is not particularly limited. For example, an epoxide and a metal catalyst, and optionally a co-catalyst, a reaction solvent, etc., are placed in an autoclave, and then mixed; then, carbon dioxide is injected into the autoclave to perform the reaction.

The amount of carbon dioxide used in the polymerization reaction is preferably 1 to 10 mol, more preferably 1 to 5 mol, and even more preferably 1 to 3 mol, per mol of epoxide.

The operating pressure of carbon dioxide used in the polymerization reaction is preferably 0.1 MPa or more, more preferably 0.2 MPa or more, and even more preferably 0.5 MPa or more, in terms of smoothly promoting the reaction, and is preferably 20 MPa or less, more preferably 10 MPa or less, and even more preferably 5 MPa or less, in terms of obtaining effects commensurate with the operating pressure.

The polymerization reaction temperature is preferably 0° C. or more, more preferably 10° C. or more, and even more preferably 20° C. or more, in terms of shortening the reaction time, and is preferably 100° C. or less, more preferably 90° C. or less, and even more preferably 80° C. or less, in terms of preventing side reactions and improving the yield.

The polymerization reaction time varies depending on the polymerization reaction conditions and cannot be generally determined; however, the polymerization reaction time is generally about 1 to 40 hours.

The above aliphatic polycarbonate resin can be used for various applications.

For example, the aliphatic polycarbonate resin of the present embodiment can be used as an aliphatic polycarbonate resin for forming partitions (aliphatic polycarbonate resin for partition formation), that is, a constituent of a partition material.

The partition material contains the above aliphatic polycarbonate resin, and may contain other components. Examples of other components include solvents, binders, light stabilizers, sensitizing agents, photosensitizers, and the like that are conventionally used for partition materials. As the type of solvent, for example, solvents conventionally used as partition materials can be used.

When the partition material of the present embodiment contains a solvent in addition to the aliphatic polycarbonate resin, the content of the aliphatic polycarbonate resin can be 5 to 30 parts by mass based on 100 parts by mass of the solvent.

A substrate having a partition made of the aliphatic polycarbonate resin of the present invention can be obtained by forming a partition pattern with a desired shape on a substrate using the above partition material. Such a partition can be formed, for example, with a coating film of the partition material containing the aliphatic polycarbonate resin of the present invention.

When the above partition material is used, a partition that allows water-based ink to remain only in a desired portion with high accuracy can be formed, because the partition material contains the aliphatic polycarbonate resin. Therefore, according to the partition material, for example, a wiring substrate having a wiring pattern controlled with high precision can be formed. That is, because a partition made of the above partition material has high water repellency, when water-based ink is placed on a substrate in which such a partition is formed, the water-based ink is less likely to be placed on the partition. This makes it possible to form a desired wiring pattern with high precision.

Accordingly, the partition material is suitable as a material for forming fine wiring controlled with high precision.

As the method for producing a substrate having a partition made of a partition material containing the aliphatic polycarbonate resin according to the present invention, for example, the above substrate can be produced by a method comprising providing a coating film of the partition material containing the aliphatic polycarbonate resin to form a partition.

Specifically, a substrate for forming a partition pattern is first prepared, and a liquid partition material is applied to a predetermined portion of the substrate surface. Subsequently, heat-treatment or irradiation with ultraviolet rays etc. is optionally performed to form a coating film of the partition material containing the polycarbonate resin of the present invention, thereby forming a partition pattern. A substrate having a partition can thereby be formed.

The portions in which the coating film of the partition material containing the polycarbonate resin of the present invention is formed can be, for example, a portion in which a wiring pattern is planned to be formed on the substrate surface, and the periphery thereof.

As the type of substrate, for example, substrates conventionally used to form wiring substrates, such as electronic substrates, can be used.

When the above substrates are used, wiring substrates that can be incorporated into various electronic components etc. can be produced.

As the method for producing a wiring substrate, for example, the wiring substrate can be produced by a method comprising providing a wiring material on the substrate to form wiring. More specifically, the wiring substrate can be produced by a production method comprising forming a groove in the substrate, and providing a wiring material in the groove to form wiring.

The above groove can be formed, for example, by photolithography or like method. The groove formation method may be other conventionally used methods. The groove may be formed so that the shape thereof is the same as the shape of the target wiring pattern.

As the method for providing a wiring material in the groove formed as described above, for example, a method of pouring the wiring material into the groove can be used. Examples of the method for pouring the wiring material into the groove include a method to immerse the substrate in which a groove is formed in a liquid wiring material, a method to apply a liquid wiring material to the substrate in which a groove is formed, and a method to inkjet-print a wiring material on the substrate in which a groove is formed.

Alternatively, the wiring substrate can be produced by a method comprising applying a wiring material to the substrate by inkjet-printing or the like to form wiring, without forming a groove in the substrate.

The type of wiring material is not particularly limited. For example, water-based ink, such as metal ink, conventionally used to form wiring can be used.

In the above substrate, a partition made of the aliphatic polycarbonate resin mentioned above is formed. Because this partition has excellent water repellency, the wiring material is allowed to remain only in a desired groove with high accuracy.

After the wiring material is provided on the substrate as described above, the substrate is heated at a temperature in which the wiring material is sintered, thereby firing the wiring material to form wiring. The sintering temperature can be suitably set depending on the type of wiring material used. As a result of the above sintering treatment, the aliphatic polycarbonate resin that forms the partition pattern is burned away.

The wiring substrate is produced through the above sintering treatment. Because the wiring pattern of the wiring substrate formed in this manner is controlled with high precision, it is possible to significantly improve the performance of electronic components etc.

As described above, according to the wiring forming method using the partition material containing the above aliphatic polycarbonate resin, fine wiring can be formed with high accuracy by a simple method, and this method is useful as a method for constructing various electronic components.

EXAMPLES

The present invention is described in more detail below with reference to Examples.

In the Examples and Comparative Example, the physical properties were evaluated by the methods shown below.

Mass Average Molecular Weight (Mw) of Aliphatic Polycarbonate Resin

An N,N-dimethylformamide solution with an aliphatic polycarbonate resin concentration of 0.5 mass % was prepared, and subjected to measurement by high-performance liquid chromatography. After measurement, the mass average molecular weight of the aliphatic polycarbonate resin was determined by comparison with polystyrene with known mass average molecular weight measured under the same conditions. The measurement conditions were as follows:

Column: GPC column (trade name: Shodex OHPac SB-800 series, produced by Showa Denko K.K.)
Column temperature: 40° C.
Eluent: 0.03 mol/L lithium bromide-N,N-dimethylformamide solution
Flow rate: 0.65 mL/min
Contact Angle of Aliphatic Polycarbonate Resin An aliphatic polycarbonate resin was dissolved in acetone so that the resin concentration was 2.5 mass %, and a glass substrate was immersed in the obtained solution. Thereafter, the glass substrate was removed from the solution, and dried at 25° C. for 24 hours, thereby producing a glass substrate coated with the aliphatic polycarbonate resin. A drop of distilled water was dropped on the glass substrate by a microsyringe so that the droplet diameter was 2 mm, and the contact angle was visually measured with a contact angle meter ("CA-S 150," produced by Kyowa Interface Science Co., Ltd.). This measurement was performed in an environment at a temperature of 25° C. and a humidity RH of 50%.

Thermal Decomposition Starting Temperature of Aliphatic Polycarbonate Resin

The thermal decomposition starting temperature was measured by "TG/DTA7220" (produced by Hitachi High-Tech Science Corporation) in a nitrogen atmosphere while increasing the temperature from room temperature to 500° C. at a heating rate of 10° C./min. The thermal decomposition starting temperature was the intersection of a line parallel to the horizontal axis passing through the mass before the start of test heating, and a tangent line drawn so that the gradient between the bending points in the decomposition curve was the maximum.

Production Example 1: Production of Organozinc Catalyst

In a 0.3-L four-necked flask equipped with a stirrer, a nitrogen gas introducing tube, a thermometer, a Dean-Stark tube, and a reflux condenser tube, 7.73 g (95 mmol) of zinc oxide, 12.3 g (100 mmol) of glutaric acid, 0.114 g (2 mmol) of acetic acid, and 76.0 g of toluene were placed. Next, while flowing nitrogen at a flow rate of 50 mL/min in the reaction system, the temperature was increased to 55° C., and the mixture was reacted by stirring at this temperature for 4 hours. Thereafter, the temperature was increased to 110° C., and azeotropic dehydration was performed by stirring at this temperature for 2 hours to remove water. Then, the reactant was cooled to room temperature, thereby obtaining a slurry liquid containing an organozinc catalyst.

Example 1

After the internal system of a 1-L autoclave equipped with a stirrer, a gas introducing tube, and a thermometer was previously replaced by a nitrogen atmosphere, 39.1 g of the slurry liquid containing an organozinc catalyst (45 mmol) obtained in Production Example 1, 192.4 g of dimethyl carbonate, 26.1 g (450 mmol) of propylene oxide, and 12.8 g (26.9 mmol) of (2,2,3,3,4,4,5,5,6,6,7,7,8,8,9,9,9-heptadecafluorononyl)oxirane were placed therein. Next, the temperature was increased to 60° C. while stirring. Then, carbon dioxide was added until the internal pressure of the reaction system was 1.0 MPa. The polymerization reaction was carried out for 10 hours while supplying carbon dioxide consumed by the reaction. After completion of the reaction, the autoclave was cooled and depressured, followed by filtration and then vacuum-drying, thereby obtaining 38.6 g of aliphatic polycarbonate resin. The mass average molecular weight of the obtained aliphatic polycarbonate resin was 354000 (Mw/Mn=7.44), and the content of the structural unit represented by the formula (1) in the aliphatic polycarbonate resin was 1.0 mol %.

Example 2

Polymerization was carried out in the same manner as in Example 1, except that 12.8 g of (2,2,3,3,4,4,5,5,6,6,7,7,8,8,9,9,9-heptadecafluorononyl) oxirane was changed to 2.9 g (6.9 mmol) of 3-(3,3,4,4,5,5,6,6,7,7,8,8,8-tridecafluorooctyloxy)-1,2-epoxypropane, thereby obtaining 41.0 g of aliphatic polycarbonate resin. The mass average molecular weight of the obtained aliphatic polycarbonate resin was 473000 (Mw/Mn=8.13), and the content of the structural unit represented by the formula (1) in the aliphatic polycarbonate resin was 0.2 mol %.

Example 3

Polymerization was carried out in the same manner as in Example 2, except that the amount of 3-(3,3,4,4,5,5,6,6,7,7,8,8,8-tridecafluorooctyloxy)-1,2-epoxypropane was changed to 4.5 g (10.8 mmol), thereby obtaining 34.6 g of aliphatic polycarbonate resin. The mass average molecular weight of the obtained aliphatic polycarbonate resin was 330000 (Mw/Mn=10.73), and the content of the structural unit represented by the formula (1) in the aliphatic polycarbonate resin was 1.2 mol %.

Comparative Example 1

Polymerization was carried out in the same manner as in Example 1, except that 12.8 g of (2,2,3,3,4,4,5,5,6,6,7,7,8,8,9,9,9-heptadecafluorononyl) oxirane was not used, thereby obtaining 40.0 g of aliphatic polycarbonate resin. The mass average molecular weight of the obtained aliphatic polycarbonate resin was 301000 (Mw/Mn=8.31).

Table 1 shows the contact angle against water and the thermal decomposition starting temperature of the aliphatic polycarbonate resins obtained in the Examples and Comparative Example. The term "Content (mol %)" in Table 1 indicates the content of the structural unit represented by the formula (1) based on the total number of moles of all structural units in the aliphatic polycarbonate resin. Further, the term "Fluorine-containing epoxide" in Table 1 indicates an epoxide used to form the structural unit represented by the formula (1).

TABLE 1

| | Fluorine-containing epoxide | Content (mol %) | Contact angle (°) | Thermal decomposition starting temperature (° C.) |
|---|---|---|---|---|
| Example 1 | (2,2,3,3,4,4,5,5,6,6,7,7,8,8,9,9,9-heptadecafluorononyl)oxirane | 1.0 | 98 | 219 |
| Example 2 | 3-(3,3,4,4,5,5,6,6,7,7,8,8,8-tridecafluorooctyloxy)-1,2-epoxypropane | 0.2 | 99 | 220 |
| Example 3 | 3-(3,3,4,4,5,5,6,6,7,7,8,8,8-tridecafluorooctyloxy)-1,2-epoxypropane | 1.2 | 99 | 217 |
| Comparative Example 1 | — | — | 68 | 215 |

A comparison between Examples 1 to 3 and Comparative Example 1 reveals that due to the introduction of a structure having a fluorine atom (X in the formula (1)) into a side chain of the aliphatic polycarbonate resin, the contact angle against water was significantly improved, and the water repellency was also improved.

Moreover, the thermal decomposition temperature was hardly increased even when such a structure was introduced. This indicates that the aliphatic polycarbonate resins can be burned away by the same heat treatment for general aliphatic polycarbonate resins.

The above results demonstrated that the aliphatic polycarbonate resins of Examples 1 to 3 had excellent water repellency. It was indicated that such aliphatic polycarbonate resins were suitable as, for example, materials for forming partitions.

INDUSTRIAL APPLICABILITY

The aliphatic polycarbonate resin according to the present invention has water-repellent performance superior to that of conventional aliphatic polycarbonate resins. For example, when a partition is formed using the aliphatic polycarbonate resin as a partition material, water-based ink is allowed to remain only in a desired portion with high accuracy. Therefore, the use of the aliphatic polycarbonate resin according to the present invention facilitates the formation of wiring substrates having highly controlled fine wiring etc., and the obtained wiring substrates can be incorporated into various electronic components etc.

The invention claimed is:

1. An aliphatic polycarbonate resin comprising a structural unit represented by the following formula (1):

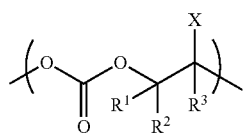
(1)

wherein $R^1$, $R^2$, and $R^3$ are each independently a hydrogen atom, a $C_1$-$C_{10}$ alkyl group, or a $C_6$-$C_{20}$ aryl group; X is a substituent having a fluorine atom; and $R^1$, $R^2$, and $R^3$ may be the same or different; and a structural unit represented by the following formula (2):

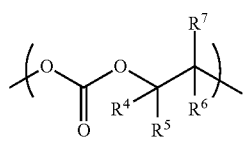
(2)

wherein $R^4$, $R^5$, $R^6$, and $R^7$ are each independently a hydrogen atom, a $C_1$-$C_{10}$ alkyl group, or a $C_6$-$C_{20}$ aryl group; and $R^4$, $R^5$, $R^6$, and $R^7$ may be the same or different, wherein the aliphatic polycarbonate resin has a contact angle against water of 90° or more, and the content of the structural unit represented by the formula (1) is 5 mol % or less based on the total number of moles of all structural units, and the content of the structural unit represented by the formula (2) is 95 mol % or more based on the total number of moles of all structural units.

2. The aliphatic polycarbonate resin according to claim 1, wherein X is a group containing a trifluoromethyl group.

3. The aliphatic polycarbonate resin according to claim 1, wherein the structural unit represented by the formula (1) is contained in an amount of 0.05 to 5 mol % based on the total number of moles of all structural units.

4. The aliphatic polycarbonate resin according to claim 1, which is an aliphatic polycarbonate resin for partition formation.

5. A partition material comprising the aliphatic polycarbonate resin according to claim 4.

6. A substrate having a partition made of the aliphatic polycarbonate resin according to claim 4.

7. A method for producing the substrate according to claim 6, the method comprising providing a coating film of a partition material comprising the aliphatic polycarbonate resin to form a partition.

8. A method for producing a wiring substrate using the substrate according to claim 6, the method comprising providing a wiring material on the substrate to form wiring.

9. The method for producing a wiring substrate according to claim 8, the method comprising forming a groove in the substrate, and providing a wiring material in the groove to form wiring.

10. A wiring forming method comprising forming wiring using the partition material according to claim 5.

* * * * *